United States Patent
Beierl et al.

(10) Patent No.: US 6,495,999 B1
(45) Date of Patent: Dec. 17, 2002

(54) METHOD AND DEVICE FOR MEASURING A MAGNETIC FIELD WITH THE AID OF THE FARADAY EFFECT

(75) Inventors: Ottmar Beierl, Aurachtal (DE); Thomas Bosselmann, Marloffstein (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/637,586

(22) Filed: Aug. 14, 2000

Related U.S. Application Data

(63) Continuation of application No. PCT/DE99/00390, filed on Feb. 11, 1999.

(30) Foreign Application Priority Data

Feb. 12, 1998 (DE) ......................... 198 05 813
Nov. 9, 1998 (DE) ......................... 198 51 551

(51) Int. Cl.$^7$ .................. G01R 31/00; G01R 33/02
(52) U.S. Cl. ........................ 324/96; 324/244.1
(58) Field of Search ................... 324/96, 244.1, 324/117 H, 117 R, 175

(56) References Cited

U.S. PATENT DOCUMENTS

| | | | |
|---|---|---|---|
| 4,531,092 A | | 7/1985 | Shibano |
| 4,539,521 A | * | 9/1985 | Matsumoto ............... 324/244.1 |
| 4,683,421 A | | 7/1987 | Miller et al. |
| 4,694,243 A | | 9/1987 | Miller et al. |
| 5,764,046 A | * | 6/1998 | Bosselmann et al. ......... 324/96 |
| 5,844,409 A | * | 12/1998 | Bosselmann et al. ......... 324/96 |

FOREIGN PATENT DOCUMENTS

| | | |
|---|---|---|
| DE | 43 12 183 | 10/1994 |
| EP | 0 088 419 A1 | 9/1983 |
| EP | 0 088 419 B1 | 6/1986 |
| EP | 0 247 842 A2 | 12/1987 |
| EP | 0 247 842 B1 | 9/1992 |

OTHER PUBLICATIONS

Published International Application No. WO 94/24573 (Bosselmann), dated Oct. 27, 1994, as mentioned on p. 5 of the specification.
Published International Application No. WO 91/01501 (Peier et al.), dated Feb. 7, 1991, as mentioned on p. 3 of the specification.

\* cited by examiner

*Primary Examiner*—N. Le
*Assistant Examiner*—James Kerveros
(74) *Attorney, Agent, or Firm*—Laurence A. Greenberg; Werner H. Stemer; Ralph E. Locher

(57) ABSTRACT

A magnetic field is measured with the aid of the Faraday effect. Light is coupled into a Faraday element subjected to the magnetic field, the light having a linearly polarized first component at a first wavelength and an unpolarized second component at a second wavelength different from the first. A light signal is coupled out of the Faraday element and is split optically into a first light signal component with the first wavelength and a second light signal component with the second wavelength. A first measurement signal is derived from the first light signal component and a second measurement signal is derived from the second light signal component and these are used to form a corrected measurement signal S. In this way, attenuation influences in the transmission paths can be largely compensated for, even when measuring a magnetic field which is constant over time or a magnetic field with a component which is constant over time.

4 Claims, 4 Drawing Sheets

METHOD AND DEVICE FOR MEASURING A MAGNETIC FIELD WITH THE AID OF THE FARADAY EFFECT

CROSS-REFERENCE TO RELATED APPLICATION

This is a continuation of international application PCT/DE99/00390, filed Feb. 11, 1999, which designated the United States.

BACKGROUND OF THE INVENTION

Field of the Invention

The invention relates to a method and a device for measuring a magnetic field, in particular for measuring an electric current flowing in a current conductor. The device and the method make use of the Faraday effect, also referred to as magnetorotation.

Optical measuring devices for measuring an electric current flowing in a current conductor by utilizing the Faraday effect are known, and are also referred to as magnetooptical current converters. The Faraday effect is understood to be the rotation of the polarization plane of linearly polarized light which is propagated in a medium in the presence of a magnetic field. The angle of the magnetorotation is proportional to the path integral over the magnetic field along the path traced by the light. The proportionality constant is known as the Verdet constant. For its part, the Verdet constant depends on the material in which the light is propagated, on the wavelength of the light and on further interfering variables which influence the properties of the material, for example the temperature and the state of mechanical stress. In order to measure the current, a Faraday element is arranged in the vicinity of the current conductor. The element contains an optically transparent material which exhibits the Faraday effect. Linearly polarized light is coupled into the Faraday element. The magnetic field generated by the electric current has the effect of rotating the plane of polarization of the light propagating in the Faraday element by a polarization rotation angle, which can be evaluated by an evaluation unit as a measure of the strength of the magnetic field and therefore of the intensity of the electric current. It is generally the case that the Faraday element surrounds the current conductor, so that the polarized light runs around the current conductor in a virtually closed path. As a result, the magnitude of the polarization rotation angle is to a good approximation directly proportional to the current intensity.

In one prior art embodiment, disclosed for example in U.S. Pat. No. 4,564,754 (see, also, European Patent 088 419), the Faraday element is designed as a solid glass ring around the current conductor. There, the light runs around the current conductor once.

In another prior art embodiment, disclosed for example in the published PCT Application WO 91/01501, the Faraday element forms a part of an optical monomode fiber, which surrounds the current conductor in the form of a measuring winding. During one passage, the light therefore runs around the current conductor N times, if N is the number of turns of the measuring winding. Two types of such magnetooptical current converters with a measuring winding consisting of an optical fiber are known, namely the transmission type and the reflection type. In the transmission type, the light is coupled into one end of the optical fiber and coupled out at the other end. The light passes through the measuring winding only once. In the reflection type, on the other hand, the other end of the optical fiber is mirrored, so that light coupled in at the first end is then reflected at this other, mirrored end, passes through the measuring winding a second time in the opposite direction and is coupled out at the first end. Due to the nonreciprocity of the Faraday effect, the plane of polarization of the light is rotated once more in the same direction by the same amount during the opposite passage. Given the same measuring winding, the rotation angle is therefore twice as high as in the transmission type. In order to separate the light coupled in and the light coupled out, a beam splitter is provided.

A problem in all of the magnetooptical current converters are disturbing influences which, for example, are brought about by changes in the attenuation constants in the optical transmission paths.

In the above-mentioned magnetooptical current converter disclosed in U.S. Pat. No. 4,564,754 (EP 088 419), the light coupled out of the Faraday element is split, in an analyzer such as a Rochon prism, a Wollaston prism, or a polarization beam splitter, into two linearly polarized light signals A and B with planes of polarization oriented at right angles to each other. These two light signals A and B are transmitted to corresponding light detectors via corresponding optical transmission fibers and converted into electrical signals PA and PB. The two signals PA and PB are used in a computing unit to calculate a Faraday rotation angle as a measurement signal, which corresponds to the quotient (PA−PB/PA+PB) of the difference and the sum of the two signals. By means of this formation of a quotient, a measurement signal is determined which is independent of the attenuation of the light signals A and B in the transmission path.

The above-mentioned U S. Pat. No. 5,764,046 (WO 94/24573) teaches to decompose the electrical signals S1 and S2 received by the receivers arranged downstream of a beam-splitting Wollaston prism in each case into a D.C. signal component D1 and D2 and an A.C. signal component A1 and A2. For each signal S1 and S2, an intensity-normalized signal P1 and P2 is then formed as the quotient P1=A1/D1 and P2=A2/D2 of its A.C. signal component A1 and A2 and D.C. signal component D1 and D2, respectively. As a result of the intensity normalization of the signals S1 and S2, fluctuations in the intensity in the transmission paths provided for the corresponding light signals LS1 and LS2, and differences in sensitivity in these two transmission paths, can be balanced out.

In that prior art method, it is assumed that the changes in attenuation that take place in the transmission path because of environmental influences are virtually static, as referred to the frequency of the alternating current to be measured. However, using that method, any change over time in the attenuation properties of the transmission path with a frequency component in the range of the frequency of the alternating current, for example a vibration of the attenuation at twice the mains frequency, cannot be balanced out. In addition, that prior art method is not suitable for measuring a direct current or a D.C. component. U.S. Pat. No. 4,694,243 (see European Patent 0 247 842) discloses the practice of coupling linearly polarized and unpolarized light whose wavelengths differ one after another into a magnetooptical sensor. Two light sources are provided for that purpose, and the two light sources are activated one after another and emit unpolarized light. A polarizer is arranged in front of the sensor which linearly polarizes the light emitted by one light source and lets the light emitted by the other light source through without polarizing it. Unpolarized and linearly polarized light are therefore coupled into the sensor one after another.

In a first receiver arranged downstream of the sensor, the light signals emerging from the sensor are converted into electrical measurement signals $S_1$, $S_2$, after passing through an analyzer. The signals are in each case compared with a reference signal $S_R$. The light source which belongs to the electrical measurement signal $S_2$ is driven on the basis of the result of this comparison in such a way that the electrical measurement signal $S_2$ becomes equal to the reference signal $S_R$.

The light intensities emitted by the two light sources are measured with the aid of a second receiver. Using a control unit connected downstream of the receiver, the intensity of the first light source is controlled in such a way that the electrical measurement signal $S_1$ generated from the linearly polarized light signal in the presence of a magnetic field at the first receiver, and the measurement signal $S_2$ generated from the unpolarized light signal are equal. In the presence of a magnetic field, the difference between the electrical measurement signal $S_1$ and the reference signal $S_R$ is then proportional to the magnetic field and independent of the intensity of the first light source.

In this way, changes in the attenuation properties of the transmission path over time can also be compensated for. In addition, a direct current or a D.C. component can be measured with that method. However, with regard to the electronic processing of the measurement signals and the control of the light sources, the prior art measuring device is complicated and susceptible to interference because of the large number of electronic components needed to control the light sources.

SUMMARY OF THE INVENTION

The object of the invention is to provide a method and device for measuring a magnetic field with the aid of the Faraday effect which overcome the above-noted deficiencies and disadvantages of the prior art devices and methods of this kind, and which permit simple compensation of the attenuation present in the transmission path.

With the above and other objects in view there is provided, in accordance with the invention, a method of measuring a magnetic field with the Faraday effect, which comprises:

coupling light having a first component with a first wavelength and a second component with a second wavelength different from the first wavelength into a transmission path leading to a Faraday element subjected to a magnetic field;

transmitting the first and second components together through a polarizing optical fiber to the Faraday element, such that the light coupled from the optical fiber into the Faraday element has a linearly polarized first light component with the first wavelength and a substantially unpolarized second component with the second wavelength, whereby the first light component is linearly polarized in the polarizing optical fiber;

optically splitting a light signal coupled out of the Faraday element into a first light signal component with the first wavelength and a second light signal component with the second wavelength;

deriving a first measurement signal from the first light signal component and a second measurement signal from the second light signal component, and generating from the first and second measurement signals a corrected measurement signal.

In other words, light is coupled into the Faraday element that is subjected to a magnetic field, the light having a linearly polarized first component and an unpolarized second component. The two components have a mutually different wavelength. The output light signal issuing from the Faraday element is split optically into the two wavelength components. A first measurement signal is thereby derived from the first light signal component and a second measurement signal is derived from the second light signal component. The two components are used to form a corrected measurement signal.

In this way, attenuation influences in the transmission paths can largely be compensated for, even when measuring a magnetic field which is constant over time or a magnetic field with a component which is constant over time. The method according to the invention thus permits the measurement of a direct current or of a current with a D.C. component which is accurate and largely independent of the attenuation properties of the transmission path.

The fact that the linear polarization of the first light component is generated in the polarizing optical fiber leading to the Faraday element, whereby the two light components are transmitted together makes for a particularly simple and loss-free assembly, since the polarizing optical fiber at the same time contributes to transmitting the light over part of the total transmission path.

In accordance with an added feature of the invention, the corrected measurement signal is formed by simple division of the first measurement signal by the second measurement signal.

With the above and other objects in view there is also provided, in accordance with the invention, a device for measuring a magnetic field with the aid of the Faraday effect.

The device has the following elements:

a light-source assembly for generating light having a first component with a first wavelength and a second component with a second wavelength;

a Faraday element;

a light transmission path connected between the light-source assembly and the Faraday element, the light transmission path including a polarizing optical fiber for linearly polarizing the first component and for jointly transmitting the first and second components to the Faraday element such that a light coupled into the Faraday element has a linearly polarized first light component with the first wavelength and a substantially unpolarized second component with the second wavelength different from the first wavelength; and a device, connected o receive an output light signal coupled out from the Faraday element, for analyzing the output light signal, the device including a wavelength-selective beam splitter for splitting the output light signal into a first light signal component with the first wavelength and a second light signal component with the second wavelength, a receiving unit connected to the beam splitter for forming a first measurement signal derived from the first light signal component and a second measurement signal derived from the second light signal component, and an evaluation device connected to the receiving unit for forming a corrected measurement signal from the first and second measurement signals.

In accordance with a concomitant feature of the invention, the evaluation device is configured to divide the first measurement signal by the second measurement signal so as to form the corrected measurement signal.

Other features which are considered as characteristic for the invention are set forth in the appended claims.

Although the invention is illustrated and described herein as embodied in a method and device for measuring a magnetic field with the aid of the faraday effect, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
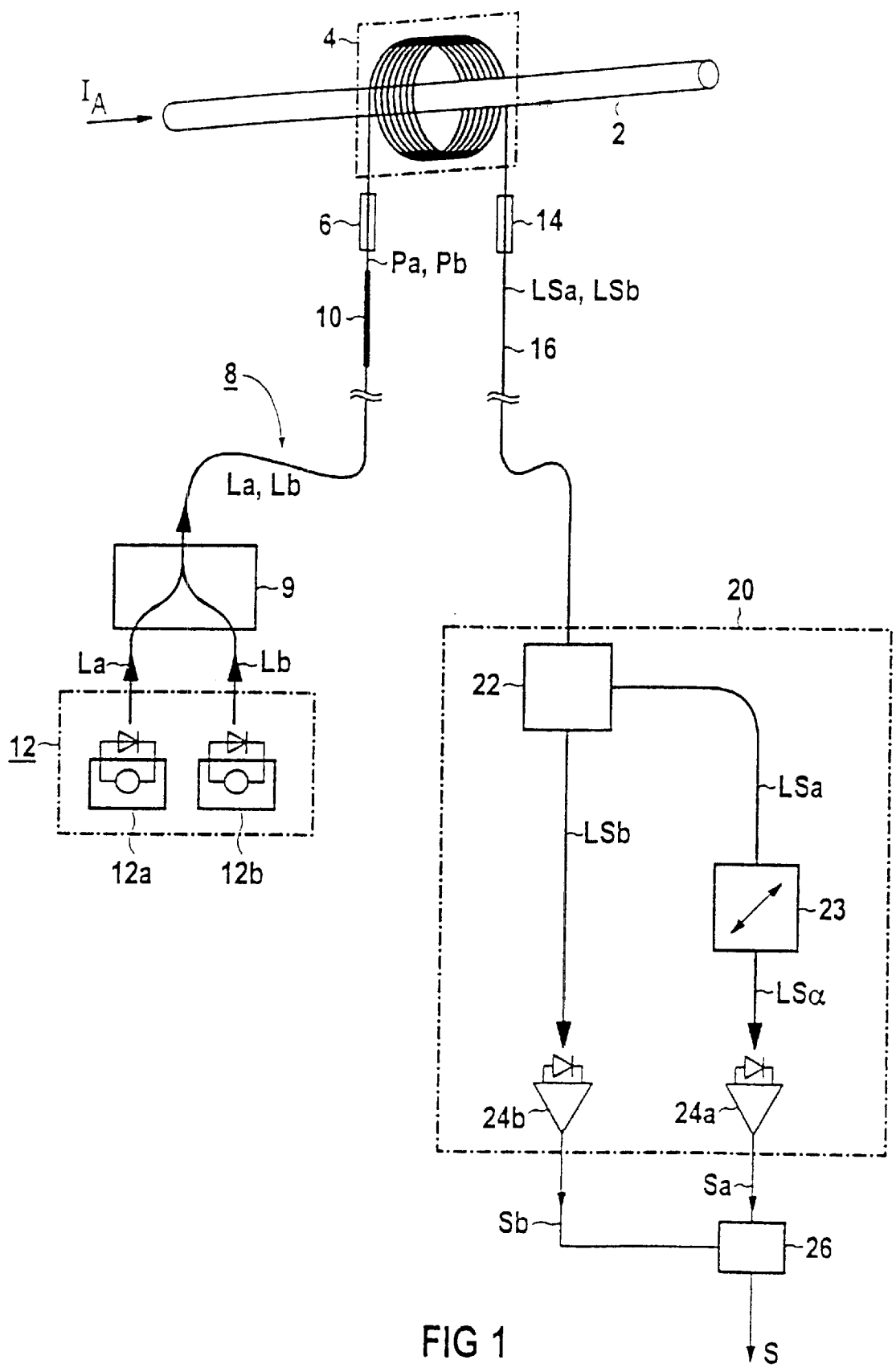
FIG. 1 is a schematic view of an exemplary embodiment of the invention.

Referring now to the figures of the drawing in detail and first, particularly, to FIG. 1 thereof, there is seen a current conductor 2 surrounded by a Faraday element 4. In the exemplary embodiment, the Faraday element 4 is illustrated as a measuring winding constructed from a monomode fiber. The input of the Faraday element 4 is coupled, via a plug-in connection 6, to an optical transmission path which is formed by an optical fiber 8 and is connected via a Y coupler 9 to two mutually independent light sources 12a and 12b of a light-source assembly 12. The light-source assembly 12 generates light with a first component La with a first wavelength λa and with a second component Lb with a second wavelength λb. The first and second components La, Lb are generated by first and second light sources 12a and 12b, respectively. The wavelengths λa, λb of the components La and Lb are different from each other. The components La and Lb are unpolarized and are transmitted simultaneously to the Faraday element 4 via the common optical fiber 8. Alternatively, it is also possible to control the light sources 12a, 12b in such a way that the components La, Lb are coupled into the transmission path alternately over time.

At the end of the transmission path, that is to say upstream of the input into the Faraday element 4, a polarizing optical fiber 10 is arranged in the transmission path. This polarizing optical fiber 10 thus forms at least part of the total transmission path from the light-source assembly 12 as far as the Faraday element 4. In the polarizing optical fiber 10, a linearly polarized first light component Pa is generated from the first component La, while the state of polarization of the component Lb essentially remains uninfluenced. The component Lb is thus coupled into the Faraday element 4 as an unpolarized second light component Pb.

The linearly polarized first light component Pa and the unpolarized second light component Pb pass through the Faraday element 4 and, at its output, are coupled, via a plug-in or splice connection 14, into a transmission path 16 which does not influence the state of polarization and which, for example, is formed by an optical fiber laid without curves and having low birefringence. A converter unit 20 is connected at the end of the transmission path 16. Instead of a polarization-neutral optical fiber, a so-called highly birefringent (i.e., double-refractive), polarization-maintaining fiber can also be used, with which linearly polarized light which is polarized parallel to one of the two mutually orthogonal axes of polarization of the optical fiber is transmitted with its state of polarization maintained.

In the Faraday element, the linearly polarized first light component Pa experiences rotation of its plane of polarization, depending on the magnetic field generated by the electric current $I_A$, and is coupled out of the Faraday element 4 as the first light signal component LSa. The second, unpolarized light component Pb coupled into the Faraday element 4 is not influenced in terms of its state of polarization by the Faraday element 4, and is coupled out of the latter as an unpolarized second light signal component LSb. The first and the second light signal component LSa and LSb are separated optically from each other in a wavelength-selective beam splitter 22 in the converter unit 20.

In an analyzer 23, a component LSα—polarized in a predefined plane of polarization—is generated from the first light signal component LSa. The analyzer 23 is preferably arranged at 45° to the plane of polarization of the linearly polarized first light component Pa coupled into the Faraday element 4. If a polarization-maintaining optical fiber is used in the transmission path 16, one of its two axes of polarization must coincide with the orientation of the axis of the analyzer 23.

The component LSα and the second light signal component LSb are each converted in an optoelectrical converter 24a and 24b, respectively, into a first and a second electrical measurement signal Sa and Sb. The first and second electrical measurement signal Sa and Sb present at the output of the optoelectrical converter 24a and 24b, if necessary corrected for the different wavelengths λa, λb in accordance with the sensitivity of the converter 24a and 24b, are fed to an evaluation device, a divider unit 26 in the exemplary embodiment, which forms a corrected measurement signal S by dividing the first measurement signal Sa by the second measurement signal in accordance with the equation S=Sa/Sb. The corrected measurement signal S is largely independent of the attenuation properties of the optical components included in the transmission path, it being assumed that the change in the attenuation resulting from environmental influences is approximately equal at the wavelengths λa and λb.

The polarization rotation angle α may also be determined directly from the corrected measurement signal S, even if only one analyzer 23 is used, since, between the intensity of the linearly polarized first light component Pa and the intensity of the unpolarized second light component Pb, there is a fixed relationship which is predefined by the light sources 12a and 12b used. The second measurement signal Sb is thus proportional to the intensity Ia of the first light signal component LSa, Sb=k·Ia, k being a proportionality factor which depends on intensities of the light components Pa and Pb. The first measurement signal Sa measured downstream of the analyzer 23 is then proportional to the square of the cosine of the angular difference between the polarization rotation angle α and the orientation α' of the analyzer 23, and the intensity of the first light signal proportion, Sa=p·cos²(α−α')·Ia, p being a further proportionality factor. The polarization rotation angle α may therefore be determined directly from the corrected measurement signal S=(p/k)·cos²(α−α').

In a further refinement of the exemplary embodiment, the light sources 12a and 12b may also be assigned detectors, which register any relative intensity fluctuations and are used for determining the correct proportionality factor k.

Figure 2:
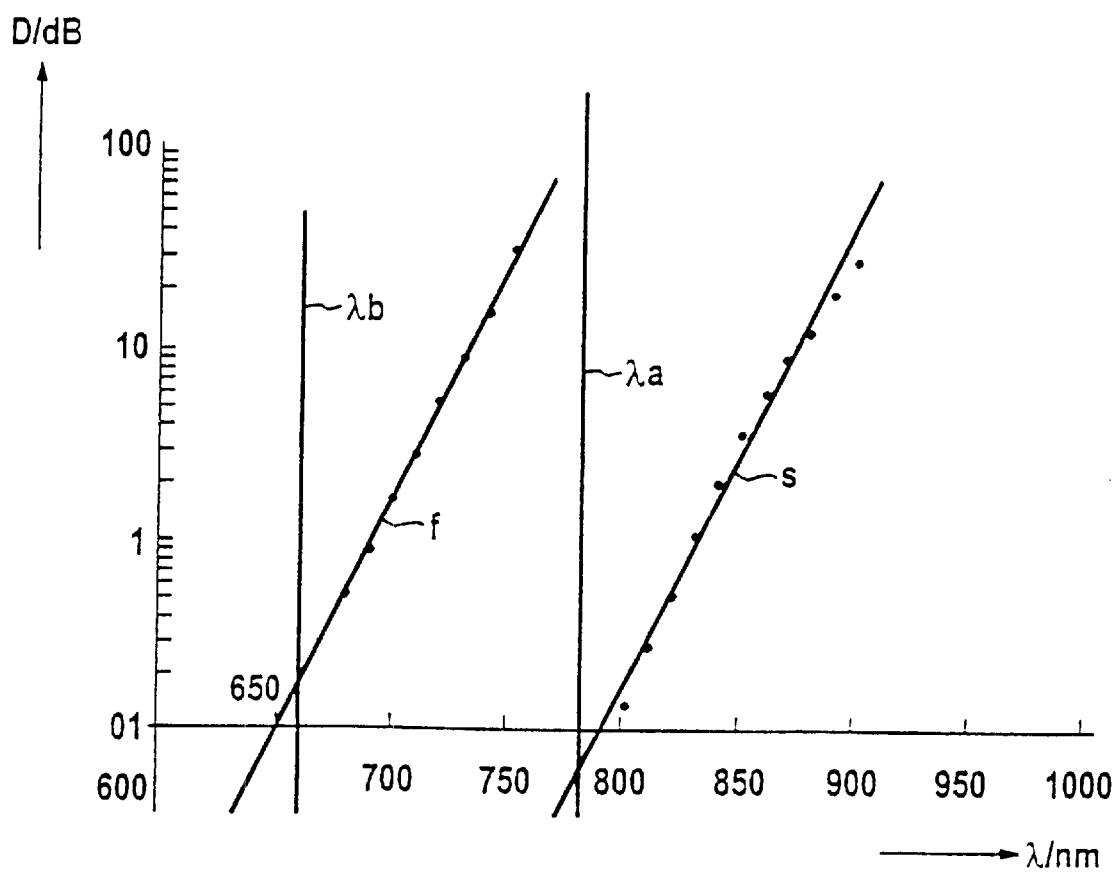
FIG. 2 is a graph plotting the transmission properties of a polarizing optical fiber—suitably provided for use in a device according to the invention—for different modes against the wavelength.

The properties of the polarizing fiber 10 will now be explained in more detail with reference to FIG. 2. The plotted data are the attenuation loss D of a polarizing fiber that is about 1.7 m long over the wavelength $\lambda$. The fiber is commercially available, for example from the 3M company under the designation FS-PZ-4616. Viewed technically, such a polarizing fiber is a highly degenerate, highly birefringent optical fiber, in which, at a specific wavelength, one of the two modes is attenuated significantly more highly than the other. Given a sufficiently long fiber length, the attenuation ratio is so great that the fiber acts as a polarizer. It can be seen from the diagram that, at a wavelength $\lambda a$ of about 770 nm, the attenuation for the fast mode f is more than one thousand times as high as the attenuation for the slow mode s. The fast mode f is therefore filtered out of light coupled into the polarizing optical fiber 10 with the wavelength $\lambda a$, so that only the linearly polarized slow mode s is coupled out at the output of the polarizing optical fiber 10.

In relation to the wavelength $\lambda a$ there is then at least one wavelength $\lambda b$ which, given an identical length of the polarizing optical fibers 10, also has a virtually negligible attenuation for both modes f and s. Although, even at the wavelength $\lambda b$, the attenuation for the slow mode s is more than 1000 dB smaller than for the fast mode f, this does not play any part at the present length of the optical fiber 10, since the attenuation of the fast mode f is also virtually negligible, at less than 0.2 dB. Unpolarized light coupled into the polarized optical fiber 10 at the wavelength $\lambda b$ is thus coupled out as unpolarized light at the output of the optical fiber.

Figure 3:
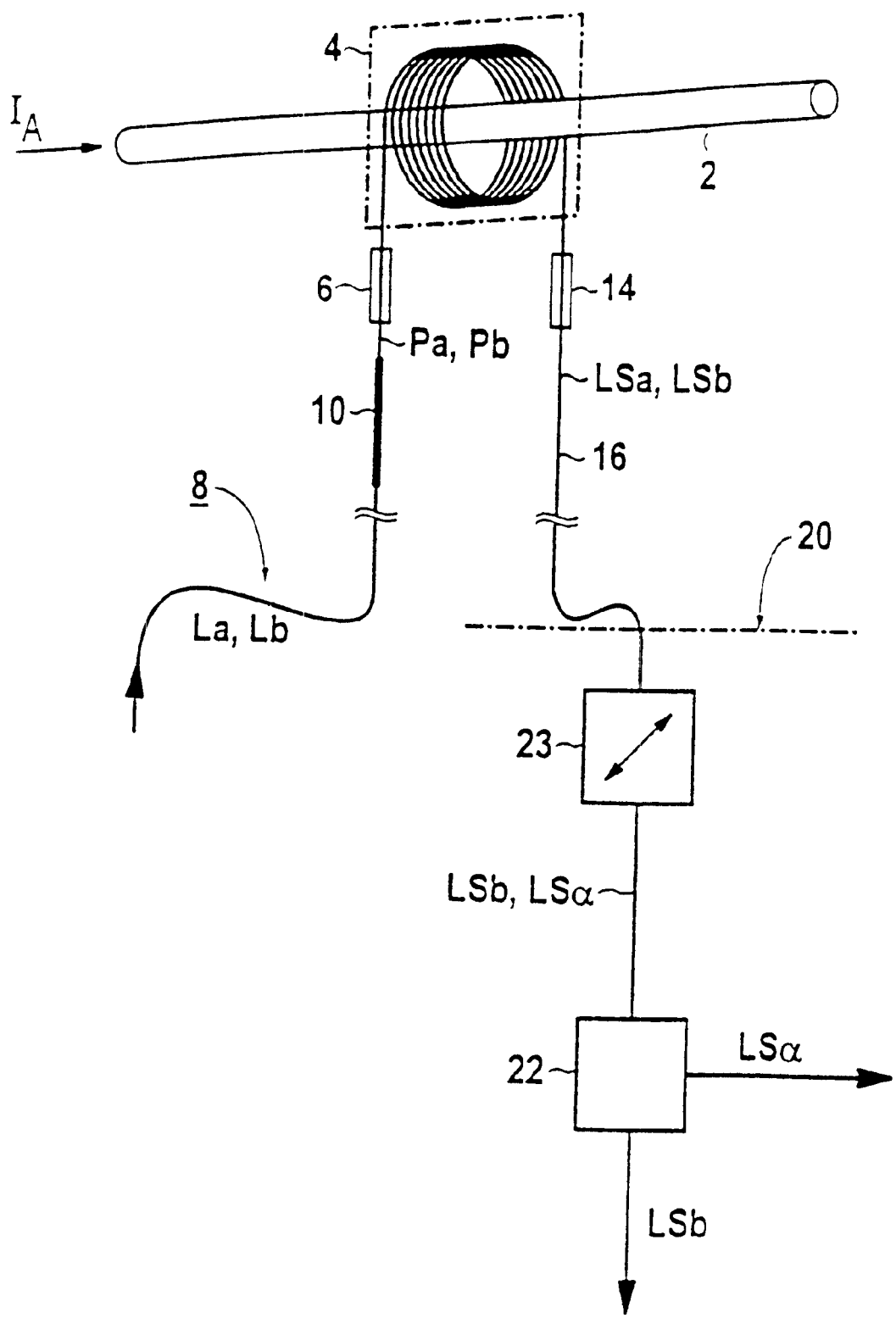
FIG. 3 is a schematic view similar to that of FIG. 1 of a further exemplary embodiment of the invention.

Referring now to the second embodiment of the invention illustrated in FIG. 3, the analyzer 23 is arranged upstream of the wavelength-selective beam splitter 22. The term upstream as used herein logically refers to the light signal propagation and useful electrical signal propagation. As shown in the exemplary embodiment of the figure, the analyzer 23 can be arranged directly upstream of the wavelength-selective beam splitter 22. In this case, a polarization-neutral or polarization-maintaining transmission path 16 is needed between the Faraday element 4 and the beam splitter 22. Alternatively, however, the analyzer 23 can be arranged directly downstream of the Faraday element 4. In this case, the transmission path 16 to the converter unit 20 can be built up using a normal standard optical fiber. In addition, the wavelength-selective filter 22 can also be arranged directly downstream of the Faraday element 4, so that the converter unit only comprises the optoelectric converters and the electrical components assigned to these.

Figure 4:
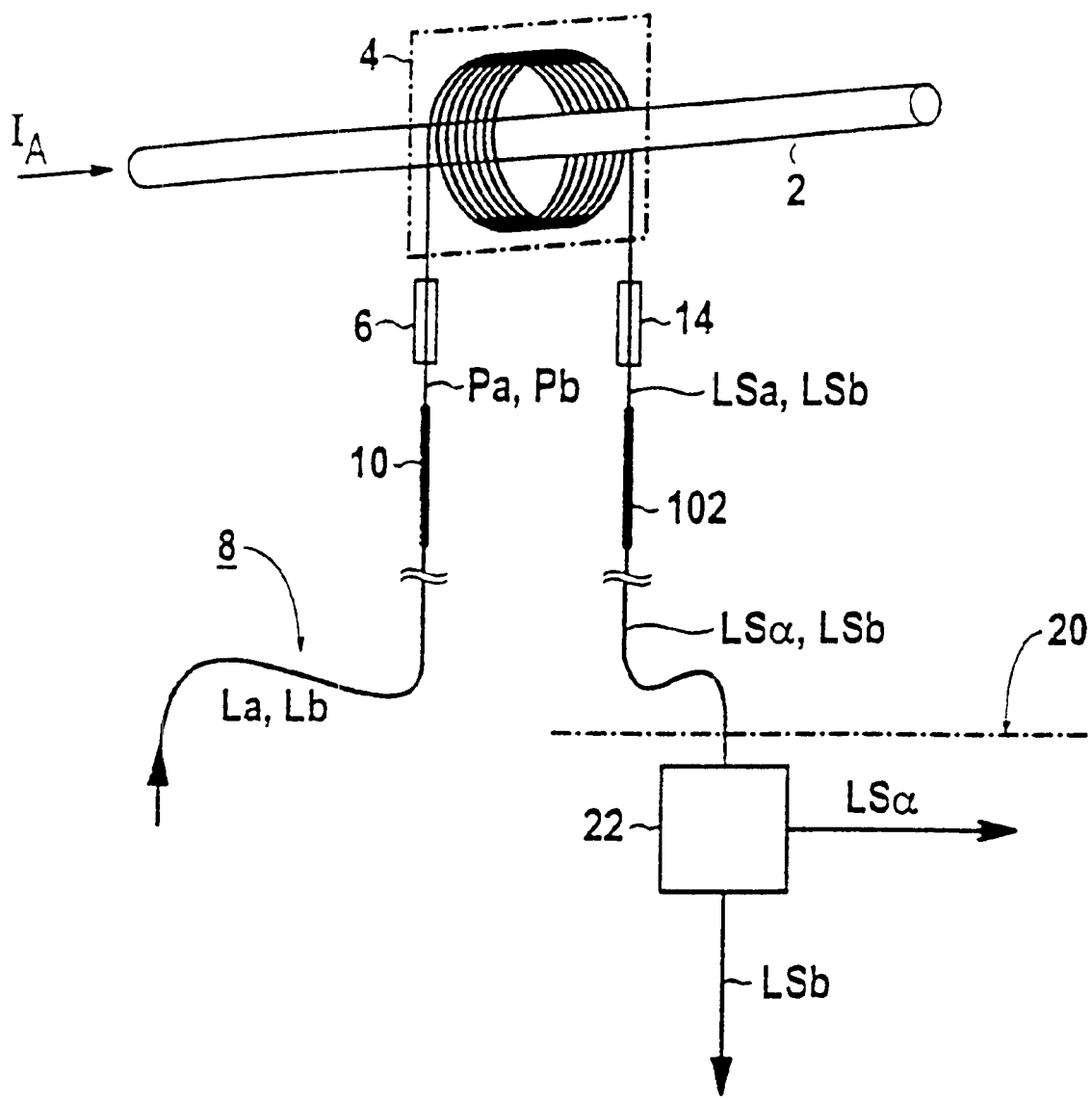
FIG. 4 is a similar schematic view of another embodiment of the invention.

In the embodiment illustrated in FIG. 4, a polarizing optical fiber 102 is provided in the transmission path from the Faraday element 4 to the wavelength-selective beam splitter 22, is identical to the optical fiber 10 and differs from the latter only with regard to the orientation of its axes of polarization. The optical fiber 102 then acts as an analyzer and replaces the analyzer 23 shown in FIGS. 1 and 3.

We claim:

1. A method of measuring a magnetic field, which comprises:

coupling light having a first component with a first wavelength and a second component with a second wavelength different from the first wavelength into a transmission path leading to a Faraday element subjected to a magnetic field;

simultaneously transmitting the first and second components together through a wavelength-dependent polarizing optical fiber to the Faraday element, such that the light coupled from the optical fiber into the Faraday element has a linearly polarized first light component with the first wavelength and a substantially unpolarized second component with the second wavelength, whereby the first light component is linearly polarized in the polarizing optical fiber;

optically splitting a light signal coupled out of the Faraday element into a first light signal component with the first wavelength and a second light signal component with the second wavelength;

deriving a first measurement signal from the first light signal component and a second measurement signal from the second light signal component, and generating from the first and second measurement signals a corrected measurement signal.

2. The method according to claim 1, wherein the generating step comprises dividing the first measurement signal by the second measurement signal for forming the corrected measurement signal.

3. A device for measuring a magnetic field, comprising:

a light-source assembly for generating light having a first component with a first wavelength and a second component with a second wavelength;

a Faraday element;

a light transmission path connected between said light-source assembly and said Faraday element, said light transmission path including a wavelength-dependent polarizing optical fiber for linearly polarizing the first component and for simultaneously transmitting the first and second components to said Faraday element such that a light coupled into said Faraday element has a linearly polarized first light component with the first wavelength and a substantially unpolarized second component with the second-wavelength different from the first wavelength; and a device, connected to receive an output light signal coupled out from said Faraday element, for analyzing the output light signal, said device including a wavelength-selective beam splitter for splitting the output light signal into a first light signal component with the first wavelength and a second light signal component with the second wavelength, a receiving unit connected to said beam splitter for forming a first measurement signal derived from the first light signal component and a second measurement signal derived from the second light signal component, and an evaluation device connected to said receiving unit for forming a corrected measurement signal from the first and second measurement signals.

4. The device according to claim 3, wherein said evaluation device is configured to divide the first measurement signal by the second measurement signal.

* * * * *